(12) United States Patent
Hayashi (10) Patent No.: US 9,198,279 B2
(45) Date of Patent: Nov. 24, 2015

(54) NOISE FILTER AND TRANSMISSION APPARATUS

(75) Inventor: Seiji Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 13/821,920

(22) PCT Filed: Sep. 16, 2011

(86) PCT No.: PCT/JP2011/071777
§ 371 (c)(1),
(2), (4) Date: Mar. 8, 2013

(87) PCT Pub. No.: WO2012/039489
PCT Pub. Date: Mar. 29, 2012

(65) Prior Publication Data
US 2013/0161084 A1     Jun. 27, 2013

(30) Foreign Application Priority Data
Sep. 24, 2010    (JP) .................... 2010-214393

(51) Int. Cl.
*H05K 1/11*    (2006.01)
*H05K 1/02*    (2006.01)

(52) U.S. Cl.
CPC ............... *H05K 1/0219* (2013.01); *H05K 1/02* (2013.01); *H05K 1/0216* (2013.01); *H05K 1/115* (2013.01); *H05K 1/116* (2013.01); *H05K 2201/093* (2013.01); *H05K 2201/0979* (2013.01); *H05K 2201/09236* (2013.01); *H05K 2201/09318* (2013.01); *H05K 2201/09336* (2013.01); *H05K 2201/09663* (2013.01)

(58) Field of Classification Search
CPC ............. H05K 1/00; H05K 1/02; H05K 1/11; H05K 1/0219; H01P 11/00; H01P 3/02; H01P 3/06; H01P 3/08; H01P 3/088
USPC ........... 174/266, 36, 250, 255, 262, 264, 268; 361/760, 763, 791; 257/691, 786; 333/1, 238; 156/47, 55
See application file for complete search history.

(56) References Cited

U.S. PATENT DOCUMENTS 4,845,311 A * 7/1989 Schreiber et al. ............... 174/36
6,133,805 A * 10/2000 Jain et al. ........................ 333/1
2002/0157865 A1 10/2002 Noda
(Continued)

FOREIGN PATENT DOCUMENTS

CN    1652395 A    8/2005
CN    1981349 A    6/2007
(Continued)

OTHER PUBLICATIONS

Circuits, Interconnections, and Packaging for VLSI, H. B. Bakoglu, Andeddison-Wesley Publishing company (1995).

*Primary Examiner* — Xiaoliang Chen
(74) *Attorney, Agent, or Firm* — Canon USA, Inc. IP Division (57) ABSTRACT

In a printed wiring board including a first wiring layer and a second wiring layer provided via an insulator layer, at least three guard ground wirings extending along a pair of signal wirings provided in the first wiring layer and supplied with a ground potential are provided between the pair of signal wirings. Thus, crosstalk noise can be reduced without widening a wiring area between the pair of signal wirings.

3 Claims, 5 Drawing Sheets

(56) References Cited

U.S. PATENT DOCUMENTS

| | | | |
|---|---|---|---|
| 2004/0201311 A1* | 10/2004 | Wong | 310/328 |
| 2004/0201319 A1* | 10/2004 | Wong et al. | 310/328 |
| 2004/0201321 A1* | 10/2004 | Wong | 310/328 |
| 2005/0206467 A1 | 9/2005 | Dohata | |
| 2008/0053694 A1 | 3/2008 | Park | |
| 2008/0169838 A1* | 7/2008 | Shim et al. | 326/82 |
| 2008/0236868 A1* | 10/2008 | Koga | 174/117 F |
| 2009/0108376 A1* | 4/2009 | Fujii et al. | 257/401 |
| 2009/0236758 A1* | 9/2009 | Tsukada | 257/786 |
| 2011/0080234 A1* | 4/2011 | Haruta | 333/193 |
| 2013/0077268 A1* | 3/2013 | Brunker et al. | 361/752 |
| 2013/0299221 A1* | 11/2013 | Oh et al. | 174/258 |

FOREIGN PATENT DOCUMENTS

| | | |
|---|---|---|
| EP | 1775737 A1 | 4/2007 |
| JP | 2002-117726 A | 4/2002 |
| JP | 2005-123520 A | 5/2005 |
| KR | 10-2007-0046732 A | 5/2007 |
| KR | 10-0744535 B1 | 8/2007 |

* cited by examiner

NOISE FILTER AND TRANSMISSION APPARATUS

TECHNICAL FIELD

The present invention relates to a printed wiring board loaded onto an electronic apparatus.

BACKGROUND ART

Multifunctionalization of an electronic apparatus has caused a circuit operation on a printed wiring board to be speeded up. In an electric signal flowing through a signal wiring, an operation frequency of a clock signal has been increased, and a rise time/fall time has been shortened. On the other hand, the electronic apparatus has tended to be miniaturized. Therefore, the printed wiring board has been designed to increase a wiring density by making a gap between signal wirings as narrow as possible.

On the background of speeding up the circuit operation and miniaturizing the printed wiring board, crosstalk in which signal waveforms interfere with each other by electromagnetic coupling between adjacent signal wirings on the printed wiring board has been a large issue in recent years. The crosstalk causes a ripple that exceeds a threshold voltage in the adjacent signal wirings to cause an erroneous operation of the apparatus, and becomes, in parallel transmission through memory wirings, jitter of a signal flowing through the adjacent wirings, to cause a timing margin to be consumed.

As means for suppressing such crosstalk, one guard wiring having a stable potential, e.g., one guard ground wiring is arranged between signal wirings. A guard ground wiring is arranged between signal wirings where crosstalk is to be suppressed so that coupling between the signal wirings is reduced, to produce a crosstalk suppression effect.

However, when the crosstalk is required to be further suppressed while there is a design constraint on a wiring area, the crosstalk cannot be suppressed to a desired crosstalk value. Regarding this issue, Japanese Patent Application Laid-Open No. 2005-123520 discusses means for providing two guard ground wirings between signal wirings. In this means, the signal wirings are respectively made to have guard grounds, to further reduce coupling between the signal wirings.

However, the crosstalk tends to be increasing due to the effects of recently speeding up and miniaturizing the electronic apparatus. In the above-described conventional means, a target to reduce the crosstalk may be unattainable. This has required a printed wiring board that produces a further crosstalk suppression effect even if the wiring area between the signal wirings is small.

Figure 5:
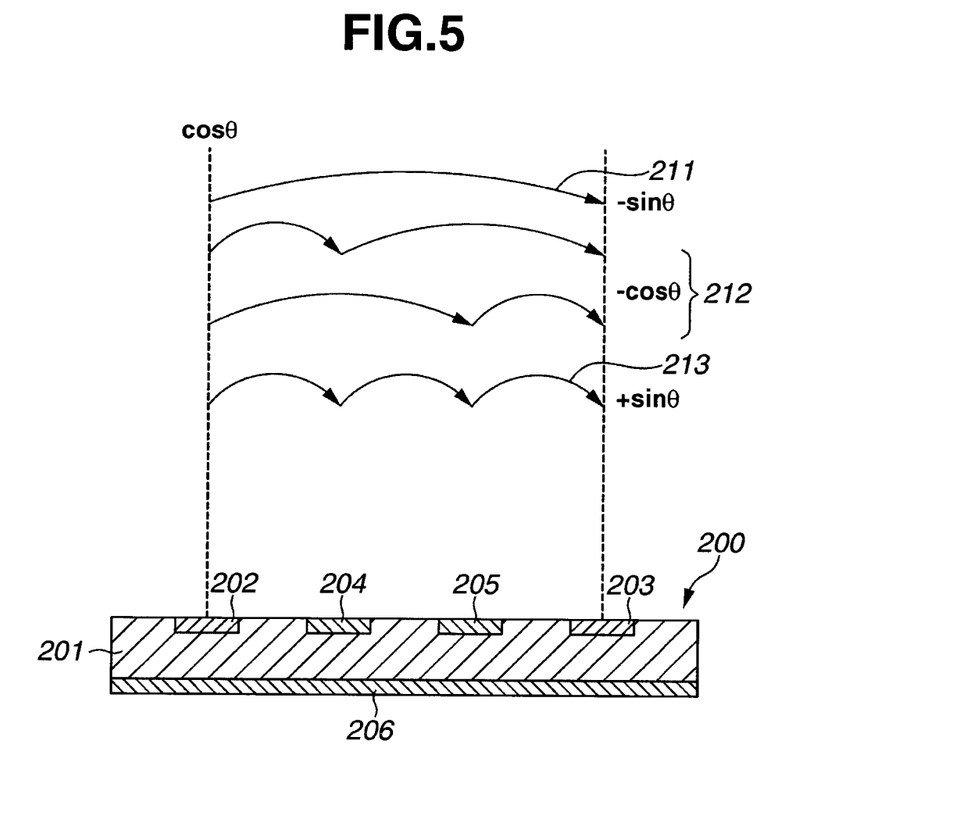
FIG. 5 is a cross-sectional view of the printed wiring board in the conventional example.

Therefore, we have considered generation of crosstalk in a conventional printed wiring board. FIG. 5 is a cross-sectional view of the conventional printed wiring board. A printed wiring board 200 includes an insulator layer 201, two signal wirings 202 and 203 arranged on one surface of the insulator layer 201, and two guard ground wirings 204 and 205 arranged between the two signal wirings 202 and 203. A ground plane 206 is arranged on the other surface of the insulator layer 201.

Consider a case where a signal that causes crosstalk to be generated in the signal wiring 202 is transmitted, and the signal wiring 203 receives the crosstalk. Crosstalk noise that propagates to the signal wiring 203 serving as a reference plane includes a direct crosstalk component 211 that directly propagates from the signal wiring 202, and a multiple crosstalk component that propagates from the signal wiring 202 via the guard ground wirings 204 and 205.

The multiple crosstalk component includes a two-stage crosstalk component 212 that propagates from the signal wiring 202 to the guard ground wiring 204 or the guard ground wiring 205, and then propagates from the guard ground wiring 204 or the guard ground wiring 205 to the signal wiring 203. The multiple crosstalk component further includes a three-stage crosstalk component 213 that propagates from the signal wiring 202 to the guard ground wiring 204, then propagates from the guard ground wiring 204 to the guard ground wiring 205, and then propagates from the guard ground wiring 205 to the signal wiring 203.

Generally, in two wirings, a waveform of crosstalk noise generated at an end, far from one of the wirings, of the other wiring is expressed by the following equation (see Circuits, Interconnections, and Packaging for VLSI, H. B. Bakoglu, Andeddison-Wesley Publishing company (1995)).

Math. 1 is as follows.

$$V(l, t) = K_f \cdot l \cdot \frac{d}{dt}[V_{in}(t - T_d)]$$

More specifically, this equation indicates that the crosstalk noise has a waveform obtained by differentiating an input waveform once. Therefore, the direct crosstalk component 211 is considered to have a waveform obtained by differentiating the original signal waveform once. The two-stage crosstalk component 212 is considered to have a waveform obtained by differentiating the original signal waveform two times. Further, the three-stage crosstalk component 213 is considered to have a waveform obtained by differentiating the original signal waveform three times.

Consider a case where a waveform of a signal having a high frequency flowing through the signal wiring 202 is represented by cos θ. The waveform of the direct crosstalk component 211 is represented by −sin θ obtained by differentiating the signal waveform once. The waveform of the two-stage crosstalk component 212 is represented by −cos θ obtained by differentiating the signal waveform cos θ two times. The waveform of the three-stage crosstalk component 213 is represented by +sin θ obtained by differentiating the signal waveform cos θ three times. More specifically, every time crosstalk is generated to propagate between conductors, a phase of a waveform is changed.

At this time, the waveform represented by −sin θ of the direct crosstalk component 211 and the waveform represented by +sin θ of the three-stage crosstalk component 213 cancel each other because they differ in phase by 180 degrees. Therefore, these components are reduced. However, no component does not cancel the waveform represented by −cos θ of the two-stage crosstalk component 212. Therefore, this component finally appears directly as crosstalk noise obtained by synthesis in the signal wiring 203.

More specifically, the guard ground wiring is a wiring, and thus becomes a path of the multiple crosstalk component. In the above-described conventional configuration, the two-stage crosstalk component cannot be reduced. Therefore, the crosstalk noise is difficult to further reduce.

CITATION LIST

Patent Literature

PTL 1 Japanese Patent Application Laid-Open No. 2005-123520

Non Patent Literature

NPL 1 Circuits, Interconnections, and Packaging for VLSI, H. B. Bakoglu, Andeddison-Wesley Publishing company (1995)

SUMMARY OF INVENTION

The present invention is directed to a printed wiring board capable of reducing crosstalk noise without widening a wiring area between a pair of signal wirings.

According to an aspect of the present invention, a printed wiring board includes an insulator layer and a first wiring layer formed on one surface of the insulator layer, wherein the first wiring layer includes a pair of signal wirings and at least three guard wirings provided between the pair of signal wirings and spaced apart from one another along the pair of signal wirings, and wherein each of the guard wirings is supplied with a reference potential or a power supply potential.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

Figure 1A:
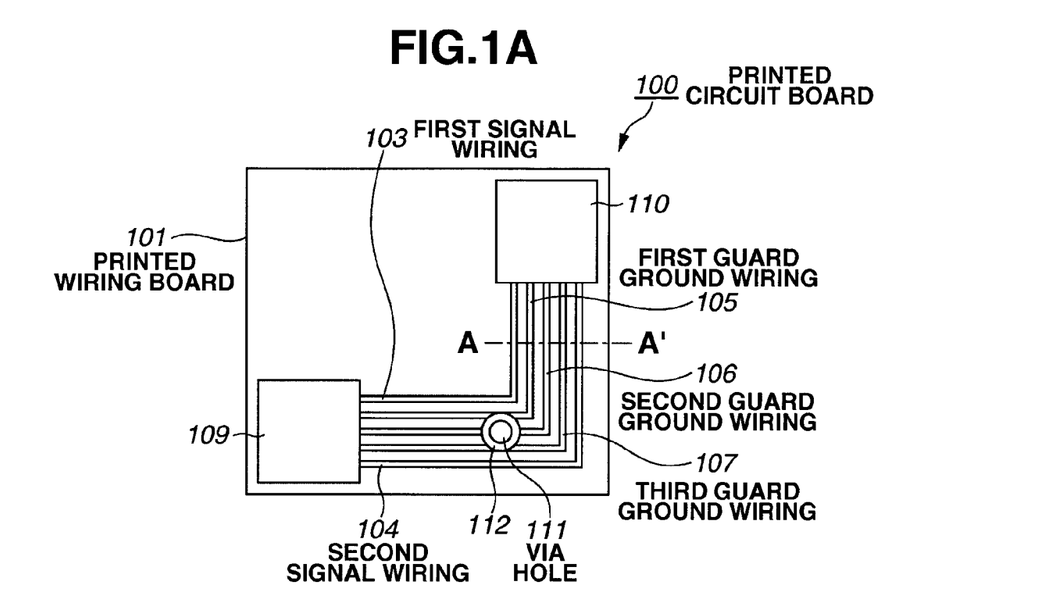
FIG. 1A is a plan view of a printed wiring board according to an exemplary embodiment.
Figure 1B:
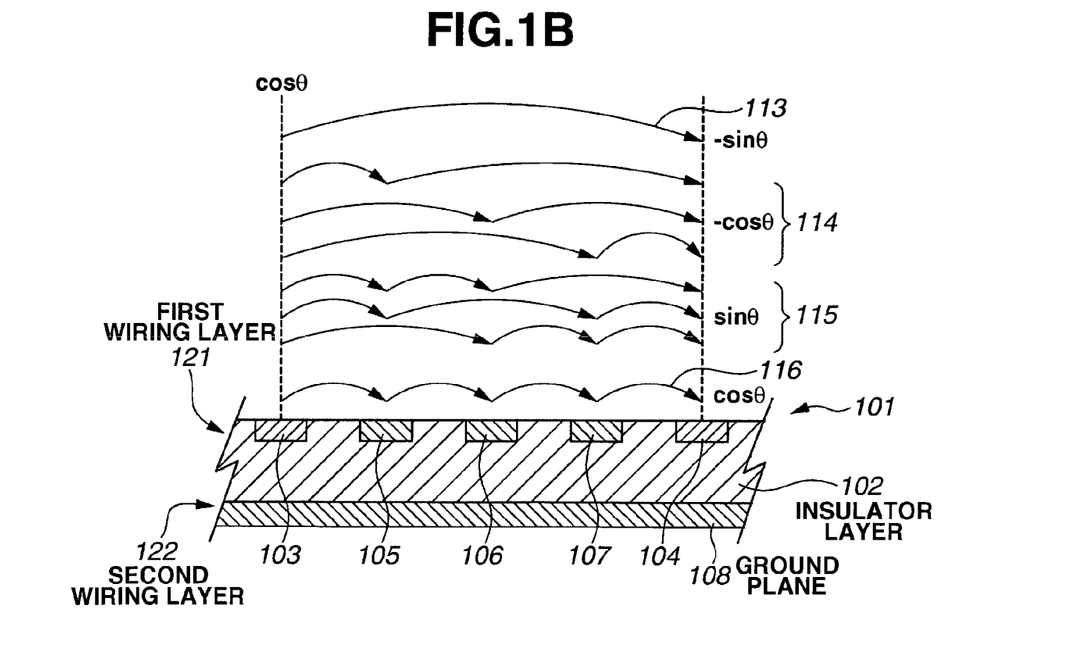
FIG. 1B is a cross-sectional view of the printed wiring board according to the exemplary embodiment.

FIGS. 1A and 1B illustrate a schematic configuration of a printed wiring board according to an exemplary embodiment of the present invention, where FIG. 1A is a plan view of the printed wiring board, and FIG. 1B is a partially sectional view of the printed wiring board along a line A-A' illustrated in FIG. 1A. As illustrated in FIG. 1A, in the present exemplary embodiment, a first semiconductor integrated circuit 109 and a second semiconductor integrated circuit 110 respectively serving as a first semiconductor device and a second semiconductor device are mounted on a printed wiring board 101, to constitute a printed circuit board 100.

The printed wiring board 101 includes an insulator layer 102, a first wiring layer 121 laminated on one surface of the insulator layer 102, and a second wiring layer 122 laminated on the other surface of the insulator layer 102, as illustrated in FIG. 1B. The insulator layer in the present invention may include a dielectric layer such as glass epoxy.

The first wiring layer 121 is provided with a wiring connecting the first semiconductor integrated circuit 109 and the second semiconductor integrated circuit 110. More specifically, the first wiring layer 121 is provided with a pair of signal wirings for transmitting a pulse signal (digital signal) having a rectangular wave shape such as a clock signal between the pair of semiconductor integrated circuits 109 and 110. More specifically, a first signal wiring 103 and a second signal wiring 104 are arranged in the first wiring layer 121. A pulse signal to be transmitted through each of the signal wirings 103 and 104 changes between a reference potential and a power supply potential.

In the present exemplary embodiment, the reference potential is a ground potential. More specifically, the pulse signal has a power supply potential at its high level and a ground potential at its low level. In the present exemplary embodiment, a plurality of signal wirings (not illustrated, other than the signal wirings 103 and 104) is arranged in the first wiring layer 121. The present exemplary embodiment aims at the two adjacent signal wirings 103 and 104 out of the plurality of signal wirings.

The signal wirings 103 and 104 are parallel to each other. FIG. 1A schematically illustrates the pair of signal wirings 103 and 104. While the pair of signal wirings 103 and 104 is curved in an L shape in FIG. 1A, it may be formed in various shapes such as a linear shape. In order to avoid other wirings (not illustrated) on a substrate, for example, various situations can be considered. For example, the signal wirings 103 and 104 partially take a shape of a crank. Alternatively, there exists a portion where one of the signal wirings is diagonal to the other signal wiring.

Therefore, a state where the signal wirings 103 and 104 are parallel to each other also includes a case where the signal wirings 103 and 104 are slightly nonparallel to each other in their respective portions.

The second wiring layer 122 is provided with a ground plane 108 serving as a plane conductor. In the present exemplary embodiment, the ground plane 108 is grounded at a metal casing (not illustrated) so that it is supplied with a potential at the same level as a ground potential in a signal flowing through each of the signal wirings 103 and 104.

In the present exemplary embodiment, the first wiring layer 121 includes three guard ground wirings serving as guard wirings provided between the pair of signal wirings 103 and 104. More specifically, a first guard ground wiring 105, a second guard ground wiring 106, and a third guard ground wiring 107 are sequentially provided from the signal wiring 103 to the signal wiring 104. The guard ground wirings 105, 106, and 107 are spaced apart from one another.

Each of the guard ground wirings 105, 106, and 107 extends along the pair of signal wirings 103 and 104 in a length direction of the signal wirings 103 and 104. In other words, each of the guard ground wirings 105, 106, and 107 extends parallel to the pair of signal wirings 103 and 104. Therefore, the guard ground wirings 105, 106, and 107 are parallel to one another.

A state where the guard ground wirings 105, 106, and 107 are parallel to one another may include a case where they are slightly nonparallel to one another in parts of their respective areas in the length direction in addition to a case where they are parallel to one another in all the respective areas in the length direction.

If the guard ground wirings are respectively set at different potentials, the probability of a short is increased between the wirings at different potentials when the wirings are brought closer to one another. Therefore, a distance between the wirings is required to be increased. On the other hand, in the present exemplary embodiment, the guard ground wirings 105, 106, and 107 are electrically connected to the ground plane 108, to respectively have ground potentials at the same level.

The respective potential levels of the guard ground wirings 105, 106, and 107 are made uniform so that a problem of the short is eliminated. Gaps among the guard ground wirings 105, 106, and 107 can be narrowed, so that the printed wiring board 101 can be miniaturized. Since the ground plane 108 and the guard ground wirings 105, 106, and 107 are at the ground potential, not bringing about characteristic degradation by resonance.

Figure 2:
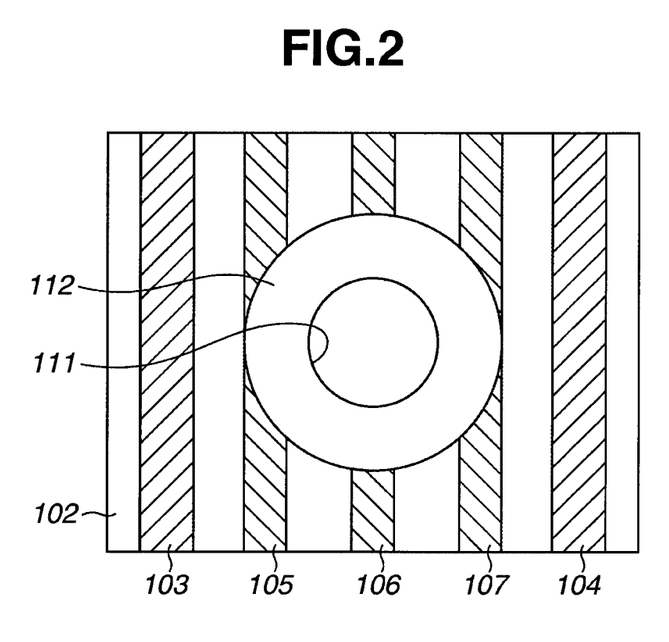
FIG. 2 is an enlarged plan view of the printed wiring board according to the exemplary embodiment.

FIG. 2 is an enlarged plan view of a via unit connecting the three guard ground wirings and the ground plane. As illustrated in FIG. 2, the insulator layer 102 is provided with one via hole 111 that penetrates through the insulator layer 102 in a wiring area between the pair of signal wirings 103 and 104. A via pad 112 electrically connected to the via hole 111 surrounding the via hole 111 is provided on the one surface of the insulator layer 102.

The via pad 112 straddles the three guard ground wirings 105, 106, and 107, and electrically connects the three guard ground wirings 105, 106, and 107 to one another. The via hole 111 is electrically connected to the ground plane 108 on the other surface of the insulator layer 102, which is not illustrated.

Therefore, the three guard ground wirings 105, 106, and 107 are electrically connected to the ground plane 108 via the one via hole 111. Thus, each of the guard ground wirings 105, 106, and 107 is electrically connected to the ground plane 108 so that its potential is stabilized, and a crosstalk suppression effect can be further improved.

The one via hole 111 connects each of the guard ground wirings 105, 106, and 107 to the ground plane 108. Thus, the widening of the wiring area between the pair of signal wirings 103 and 104 can be more greatly suppressed than when a via hole and a via pad corresponding to each of the guard ground wirings 105, 106, and 107 are arranged.

In the present invention, the ground plane 108 is not necessarily an indispensable component. However, the provision of the ground plane 108 is the most preferable form, considering the above-described characteristic degradation of a transmission signal by resonance and ease of supplying a stable potential to the guard ground wirings 105, 106, and 107 via the via hole 111.

Crosstalk occurring, when a signal is made to flow through the one signal wiring 103 in the printed wiring board 101, on the other signal wiring 104 will be described below. If a pulse signal such as a clock signal is input to the signal wiring 103, crosstalk noise having a high-frequency component serving as a differentiated waveform occurs in the signal wiring 104. In the crosstalk noise, the high-frequency component may become a problem. Therefore, a waveform of the high frequency component will be described as $\cos \theta$.

As illustrated in FIG. 1B, there is a plurality of paths until energy of a signal, which propagates through the signal wiring 103, propagates to the signal wiring 104 to appear as crosstalk. The paths can be classified depending on how many different conductors the signal energy has passed through.

Crosstalk noise that propagates to the signal wiring 104 includes a direct crosstalk component 113 following a path that directly propagates from the signal wiring 103 and a multiple crosstalk component following a path that propagates from the signal wiring 103 via the guard ground wirings 105, 106, and 107. The multiple crosstalk component includes a two-stage crosstalk component 114, a three-stage crosstalk component 115, and a four-stage crosstalk component 116.

The two-stage crosstalk component 114 is crosstalk noise that propagates to any one of the guard ground wirings once and propagates to the signal wiring 104. The number of propagation paths of the two-stage crosstalk component 114 is three.

More specifically, there are a path of the signal wiring 103, the guard ground wiring 105, and the signal wiring 104, a path of the signal wiring 103, the guard ground wiring 106, and the signal wiring 104, and a path of the signal wiring 103, the guard ground wiring 107, and the signal wiring 104.

The three-stage crosstalk component 115 is crosstalk noise that propagates to any one of the guard ground wirings once, propagates to the other guard ground wiring once again, and then propagates to the signal wiring 104. The number of propagation paths of three-stage crosstalk components 115 is three.

More specifically, there are a path of the signal wiring 103, the guard ground wiring 105, the guard ground wiring 106, and the signal wiring 104, a path of the signal wiring 103, the guard ground wiring 105, the guard ground wiring 107, and the signal wiring 104, and a path of the signal wiring 103, the guard ground wiring 106, the guard ground wiring 107, and the signal wiring 104.

The four-stage crosstalk component 116 is crosstalk noise that sequentially propagates through all the three guard ground wirings 105, 106, and 107 from the signal wiring 103 and propagates to the signal wiring 104.

Crosstalk is known to have a waveform that has been differentiated once every time it passes through the wiring once. Thus, when a signal of $\cos \theta$ is transmitted to the signal wiring 103, the direct crosstalk component 113 appears as a crosstalk waveform having a phase represented by $-\sin \theta$ in the signal wiring 104.

The two-stage crosstalk component 114 appears as a crosstalk waveform having a phase represented by $-\cos \theta$ in the signal wiring 104. The three-stage crosstalk component 115 appears as a crosstalk waveform having a phase represented by $+\sin \theta$ in the signal wiring 104. The four-stage crosstalk component 116 appears as a crosstalk waveform having a phase represented by $+\cos \theta$ in the signal wiring 104.

Therefore, in the signal wiring 104, the direct crosstalk component 113 having the waveform represented by $-\sin \theta$ and the three-stage crosstalk component 115 having the waveform represented by $+\sin \theta$ cancel each other.

Further, in the signal wiring 104, the two-stage crosstalk component 114 having the waveform represented by $-\cos \theta$ and the four-stage crosstalk component 116 having the waveform represented by $+\cos \theta$ cancel each other. Therefore, by arranging the three guard ground wirings 105, 106, and 107 between the pair of signal wirings 103 and 104, there exist counterpart crosstalk components that respectively cancel all the crosstalk components.

Even when the signal flowing through the signal wiring 103 is $\sin(\theta+\alpha)$, crosstalk components similarly cancel each other. Since a pulse signal such as a clock signal can be represented by synthesis of sine waves that differ in frequency, the crosstalk components similarly cancel each other in each of frequency components.

As described above, the three guard ground wirings 105, 106, and 107 are arranged between the signal wirings 103 and 104. Therefore, crosstalk noise, which occurs in the signal wiring 104 when a signal flows in the one signal wiring 103, can be significantly reduced.

While the present invention has been described based on the above-described exemplary embodiment, the present invention is not limited to this. While in the above-described exemplary embodiment, the number of guard ground wirings serving as guard wirings is three, the number of guard wirings may be three or more, in which case a similar effect to that in the above-described exemplary embodiment can be produced.

While in the above-described exemplary embodiment, the plane conductor is the ground plane, and each of the guard wirings is the guard ground wiring that is connected to the ground plane and supplied with the ground potential serving as the reference potential, the present invention is not limited to this configuration. More specifically, a reference plane for a signal maybe at a potential level of a power supply voltage, so that the plane conductor is supplied with a power supply potential, and each of the gourd wirings is connected to the plane conductor and supplied with a power supply potential, in which case a similar effect is also produced.

While in the above-described exemplary embodiment, the signal is a pulse signal, the present invention is not limited to this. A similar effect to that in the above-described exemplary embodiment can be produced for signals having all waveforms.

Example 1

Figure 3A:
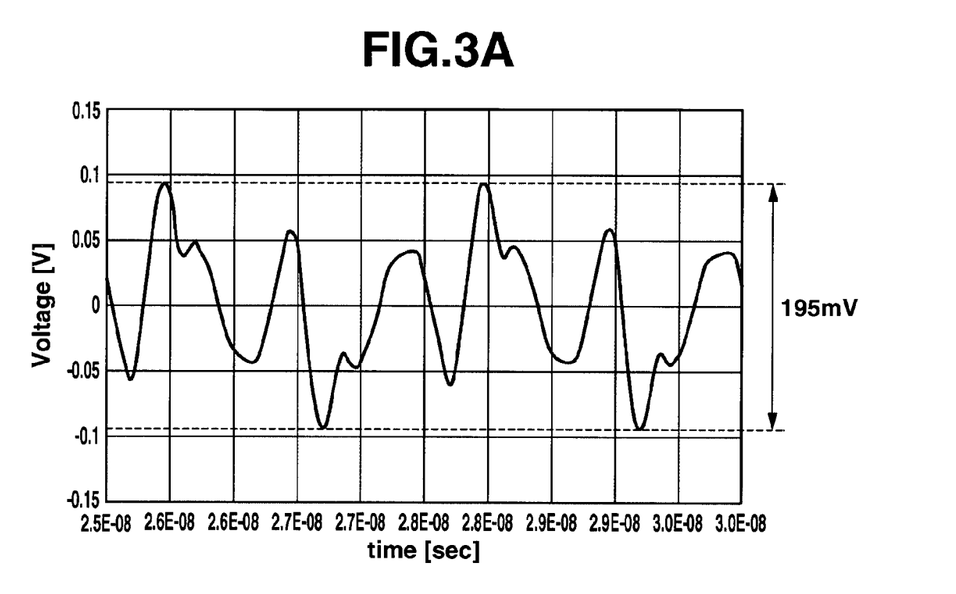
FIG. 3A is a graph illustrating an analysis result of crosstalk in a printed wiring board in an example.
Figure 3B:
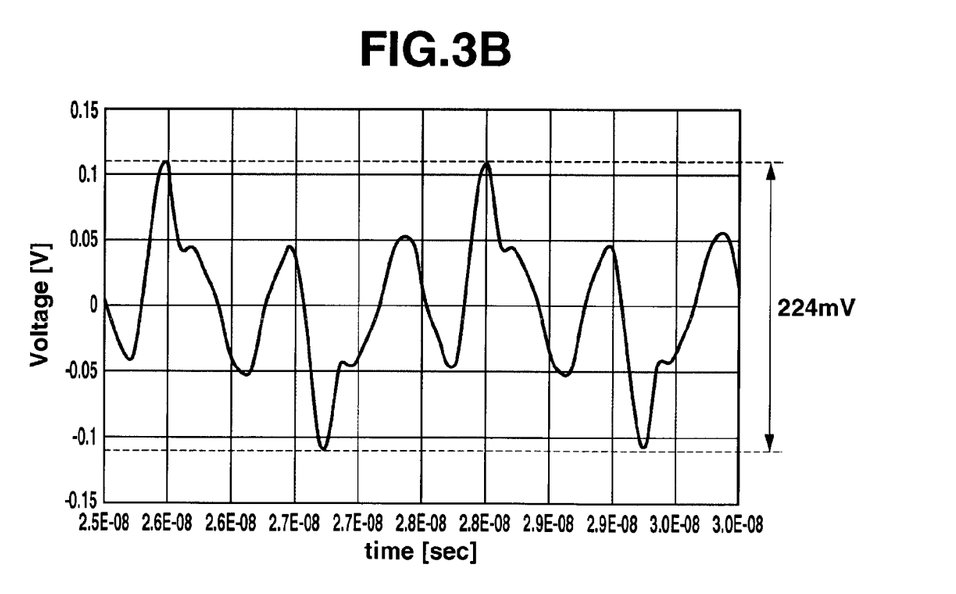
FIG. 3B is a graph illustrating an analysis result of crosstalk in a printed wiring board in a conventional example.

FIGS. 3A and 3B illustrate analysis results of crosstalk generated in the printed wiring board in the present example and the printed wiring board in the conventional example. FIG. 3A illustrates the analysis result of crosstalk noise generated in the printed wiring board in the present example.

As to wiring specifications, both the signal wirings 103 and 104 had a conductor width of 0.125 mm, all the guard ground wirings 105, 106, and 107 had a conductor width of 0.12 mm. Both a gap between the signal wiring 103 and the guard ground wiring 105 and a gap between the signal wiring 104 and the guard ground wiring 107 were 0.125 mm.

Both a gap between the guard ground wiring 105 and the guard ground wiring 106 and a gap between the guard ground wiring 106 and the guard ground wiring 107 were 0.12 mm. Therefore, a total width including the gaps among the three guard ground wirings 105, 106, and 107 was 0.6 mm.

Generally when one guard ground wiring is arranged between signal wirings, only the diameter of a via pad for connecting the guard ground wiring and a reference plane may be ensured as the width of the guard ground wiring. A pad diameter of a via hole having a hole diameter of 0.3 mm frequently used for a printed wiring board having a plate thickness of 1.6 mm may be approximately 0.6 mm.

The total width 0.6 mm of the three guard ground wirings 105, 106, and 107 in the present exemplary embodiment is easily feasible. Further, the conductor width 0.12 mm of each of the guard ground wirings 105, 106, and 107 and the gap 0.12 mm among the guard ground wirings 105, 106, and 107 are not specifications greatly preventing a manufacturing property but specifications generally used, and are easily feasible. The length of each of the signal wirings 103 and 104 was 100 mm, and a distance between the first wiring layer 121 and the second wiring layer 122 was 0.2 mm.

In the above-described configuration, when a clock signal having an amplitude of 1V and having a frequency of 400 MHz is transmitted as an input signal, crosstalk noise has a voltage waveform as illustrated in FIG. 3A. At this time, the maximum amplitude of the voltage waveform of the crosstalk noise was approximately 195 mV.

FIG. 3B illustrates the analysis result of crosstalk noise generated in a printed wiring board in which the two guard ground wirings 204 and 205 are inserted between the signal wirings 202 and 203 in the conventional example illustrated in FIG. 5.

As to wiring specifications, the signal wirings 202 and 203 were equal in a conductor width 0.125 mm, a distance therebetween, and a wiring area to those in the present example. Distances between the two guard ground wirings 204 and 205 and the signal wirings 202 and 203 respectively closer thereto were 0.125 mm, like those in the present example.

Both the conductor widths of the two guard ground wirings 204 and 205 were 0.2 mm, and the gap between the guard ground wirings was 0.2 mm. Analysis was performed under similar conditions such as a signal to be input and a wiring length to those in the present example. At this time, the maximum amplitude of a voltage waveform of crosstalk noise was approximately 224 mV.

When a measure of suppression of crosstalk noise was set to 200 mV that was 20 percent of the signal amplitude 1 V, the crosstalk noise was 224 mV, which was above the measure, in the conventional example as illustrated in FIG. 3B. On the other hand, crosstalk noise could be suppressed to 195 mV, which was below the measure, in the present example as illustrated in FIG. 3A while the wiring area was the same as that in the conventional example.

Even if the number of guard ground wirings is three or more, a cancellation component is always generated for multiple crosstalk via any of the guard ground wirings. Therefore, a crosstalk noise reduction effect by the above-described mechanism can be obtained.

Figure 4:
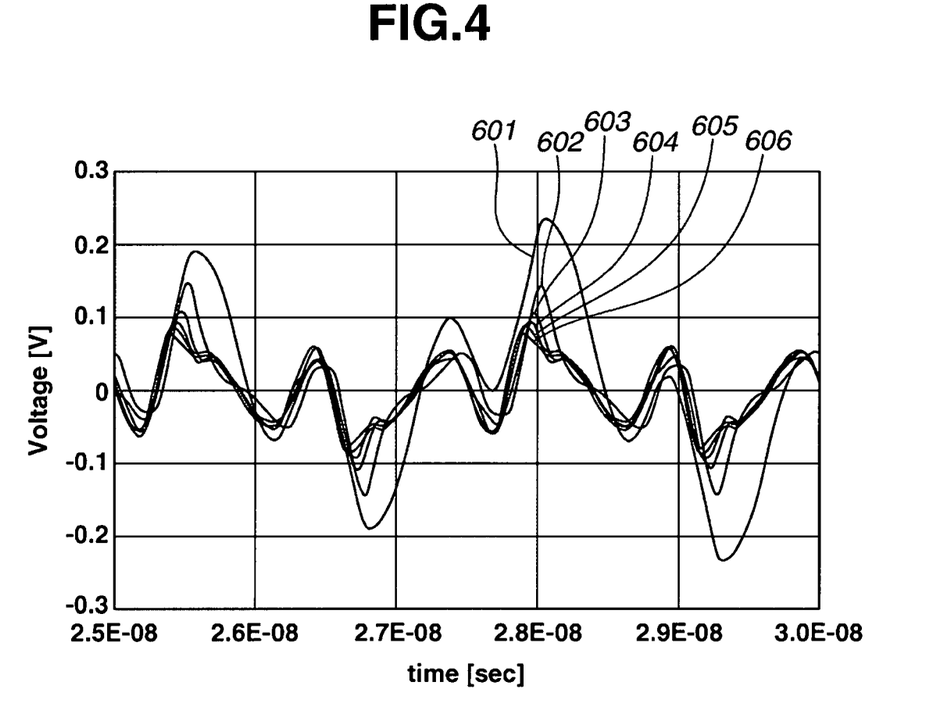
FIG. 4 is a graph illustrating an analysis result of crosstalk in the printed wiring board in the example.

The foregoing will be described below by a specific example. FIG. 4 illustrates waveforms of crosstalk noise generated in the signal wirings while a distance between the signal wirings is a constant value of 0.85 mm, when the number of guard ground wirings arranged between signal wirings is changed. The width and the length of the signal wiring are respectively 0.125 mm and 100 mm. An input signal is a clock signal having an amplitude of 1.0 V and having a frequency of 400 MHz. A gap between a wiring layer having the signal wirings provided therein and a ground plane is 0.2 mm.

A voltage waveform 601 is a voltage waveform of crosstalk noise generated when there is no guard ground wiring. A gap between signal wirings is 0.85 mm. A voltage waveform 602 is a voltage waveform of crosstalk noise generated when one guard ground wiring spaced 0.125 mm apart from each of signal wirings and having a width of 0.6 mm exists between the signal wirings.

A voltage waveform 603 is a voltage waveform of crosstalk noise generated when two guard ground wirings exist between signal wirings. As a cross-sectional shape at this time, both the widths of the two signal wirings are 0.125 mm, and both the widths of the two guard ground wirings are 0.2 mm. A gap between the guard ground wiring and the signal wiring is 0.125 mm, and a gap between the guard ground wirings is 0.2 mm.

A voltage waveform 604 is a voltage waveform of crosstalk noise generated when three guard ground wirings exist between signal wirings. As a cross-sectional shape at this time, both the widths of the two signal wirings are 0.125 mm, and all the widths of the three guard ground wirings are 0.12 mm. A gap between the guard ground wiring and the signal wiring is 0.125 mm, and a gap between the guard ground wirings is 0.12 mm.

A voltage waveform 605 is a voltage waveform of crosstalk noise generated when four guard ground wirings exist between signal wirings. As a cross-sectional shape at this time, both the widths of the two signal wirings are 0.125 mm, and all the widths of the four guard ground wirings are 0.86 mm. A gap between the guard ground wiring and the signal wiring is 0.125 mm, and a gap between the guard ground wirings is 0.086 mm.

A voltage waveform 606 is a voltage waveform of crosstalk noise generated when five guard ground wirings exist between signal wirings. As a cross-sectional shape at this time, both the widths of the two signal wirings are 0.125 mm, and all the widths of the five guard ground wirings are 0.066 mm. A gap between the guard ground wiring and the signal wiring is 0.125 mm, and a gap between the guard ground wirings is 0.066 mm.

Table 1 lists the maximum amplitudes of the voltages of the crosstalk noise generated in the signal wirings in the voltage waveforms 601 to 606.

TABLE 1

|  | Number of guard ground wirings | | | | | |
|---|---|---|---|---|---|---|
|  | 0 (No guard ground wiring) | 1 | 2 | 3 | 4 | 5 |
| Crosstalk noise (mV) | 499 | 304 | 224 | 195 | 181 | 161 |

A peak value 499 mV of a crosstalk voltage obtained when there is no guard ground wiring is reduced to the peak value 304 mV when one guard ground wiring is inserted between the signal wirings, and is reduced to the peak value 224 mV when two guard ground wirings are inserted therebetween. Further, the peak value of the crosstalk voltage is further reduced to 195 mV, 181 mV, and 161 mV when the number of guard ground wirings is increased from three to five. The provision of three or more guard ground wirings produces a crosstalk noise reduction effect.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims the benefit of Japanese Patent Application No. 2010-214393, filed Sep. 24, 2010, which is hereby incorporated by reference herein in its entirety.

The invention claimed is:

1. A printed wiring board comprising:
an insulator layer;
a first wiring layer formed on one surface of the insulator layer, wherein the first wiring layer includes a pair of signal wirings and at least three guard wirings provided between the pair of signal wirings, and wherein the least three guard wirings are spaced apart from one another along the pair of signal wirings; and
a second wiring layer formed on another surface of the insulator layer and provided with a plane conductor,
wherein one via hole and all of the at least three guard wirings are configured to electrically connect the at least three guard wirings to the plane conductor via the one via hole so that all of the at least three guard wirings have substantially the same potential.

2. The printed wiring board according to claim 1, wherein the one via hole crosses all of the at least three guard wirings and electrically connects all of the at least three guard wirings to the plane conductor.

3. In a printed circuit board having a printed wiring board, a first semiconductor device mounted on the printed wiring board, and a second semiconductor device mounted on the printed wiring board, the printed wiring board comprises:
an insulator layer;
a first wiring layer formed on one surface of the insulator layer, wherein the first wiring layer includes a pair of signal wirings and at least three guard wirings provided between the pair of signal wirings and wherein the least three guard wirings are spaced apart from one another along the pair of signal wirings; and
a second wiring layer formed on another surface of the insulator layer and provided with a plane conductor,
wherein one via hole and all of the least three guard wirings are configured to electrically connect the at least three guard wirings to the place conductor via the one via hole so that all of the at least three guard wirings have substantially the same potential, and
wherein one end of the pair of signal wirings is connected to the first semiconductor device and another end of the pair of signal wirings is connected to the second semiconductor device.

* * * * *